United States Patent
Kengeri

[11] Patent Number: 6,108,250
[45] Date of Patent: Aug. 22, 2000

[54] FAST REDUNDANCY SCHEME FOR HIGH DENSITY, HIGH SPEED MEMORIES

[75] Inventor: Subramani Kengeri, Cupertino, Calif.

[73] Assignee: Alliance Semiconductor Corporation, Santa Clara, Calif.

[21] Appl. No.: 09/293,494

[22] Filed: Apr. 15, 1999

[51] Int. Cl.$^7$ ................................................ G11C 7/00
[52] U.S. Cl. .......................................................... 365/200
[58] Field of Search ................................... 365/200, 201; 371/21.1, 22.2, 22.5; 714/7

[56] References Cited

U.S. PATENT DOCUMENTS

| | | | |
|---|---|---|---|
| 5,204,836 | 4/1993 | Reed | 365/200 |
| 5,377,146 | 12/1994 | Reddy et al. | 365/200 |
| 5,659,551 | 8/1997 | Huott et al. | 371/22.2 |
| 5,805,789 | 9/1998 | Huott et al. | 371/22.5 |
| 5,901,093 | 5/1999 | Hiltebeitel et al. | 365/200 |
| 5,961,653 | 10/1999 | Lalter et al. | 714/7 |

*Primary Examiner*—Richard Elms
*Assistant Examiner*—Anh Phung
*Attorney, Agent, or Firm*—Beyer Weaver & Thomas, LLP

[57] ABSTRACT

A high speed process for determining whether an externally applied address points to a memory cell or a redundant memory cell in a memory is disclosed. Identification information associated with redundant memory rows and columns is stored and compared with decoded information based upon a decoded externally applied address. This comparison determines if a memory cell of a redundant memory cell is addressed.

6 Claims, 4 Drawing Sheets

FAST REDUNDANCY SCHEME FOR HIGH DENSITY, HIGH SPEED MEMORIES

BACKGROUND OF THE INVENTION

1. Field of the Invention

The present invention relates to high-density monolithic memories and, in particular, to a more effective and fast the utilization of hierarchical redundancy schemes to convert a partially functional memory chip into a fully functional chip thereby improving the overall performance of functional chips on a semiconductor wafer.

2. Discussion of the Related Art

Today's highly advanced computer and electronic systems require high speed and high density memory chips. The increase in the density of the memory chip results in the complexity of the manufacturing processes used to manufacture the memory chips. Consequently, the possibility of defective memory cells or rows of memory cells increases. The defect density resulting from the integrated circuit fabrication process limits the functional yield. While an increasing amount of attention has been focused on controlling the fabrication process to limit defect density, as chip geometries shrink and chip size increases, it becomes increasingly difficult to control the process sufficiently to achieve a high natural functional yield.

A number of techniques, such as redundancy schemes, have been utilized to increase the functional yield of memory devices. A commonly used redundancy scheme provides spare rows and/or columns in the memory array that can be used to replace defective bits, rows or columns.

During the fabrication of a monolithic memory device, process defects can disable single or multiple cells, rows and/or columns in the array. Typically to overcome these defects, spare or redundant rows and/or redundant columns are provided. These spare memory cells are then utilized to replace defective cells, rows and/or columns. If there is a defect in a given section of the memory array, causing a normal row or a normal column or a single bit to fail, then that particular row or column or bit is permanently disabled and is replaced by a redundant row or a redundant column. The obvious limitation on the number of redundant rows and/or columns is the acceptable chip size and cost.

Each redundant row or column is associated with one fuse or a set of fuses. When the particular fuse or set of fuses is/are blown, the redundant row or column is used instead of the defective row or column. Referring now to FIG. 1, a schematic of a conventional fuse arrangement is shown. Fuse arrangement 10 includes multiple sub arrangements 12-1 through 12-n. Each of the sub arrangements 12-1 through 12-1 includes a series of fuses 14 that are connected to the supply voltage Vcc through transistor 16 and to ground through a transistor 18 connected in series with a resistors 20. Each of the sub arrangements 12-1 through 12-n has a respective output O1 through On that is used individually or in combination with the output of other sub arrangements to select a redundant row or column. If a redundant row or column is selected to replace a defective row or column of memory cell, the corresponding fuse or set of fuses will be blown.

In operation, the external address is decoded by the decoding circuitry in a memory chip. The decoded address also points to an specific fuse or a set of fuses. For example, a 16 bit address can be divided to four 4-bit address bits, with each 4-bit representing an address to one fuse. In the arrangement of FIG. 1, each fuse would belong to a separate sub arrangement. Thus, in this example, each redundant row or column is associated with four fuse 14. Next, the addressed fuses 14 are examined to determine whether they are blown, signifying the fact that the corresponding row or column is selected, or not.

To examine the particular fuse, the associated transistor 18 is turned on. At the same time all the other transistors 18 in the sub arrangement 12-1, for example, are turned off. The voltage at the output node O1 is then examined. If the fuse is blown, then the current path through the fuse 14, transistor 18, and resistor 20 is open, thus the voltage at output O is at Vcc level. On the other hand, if the fuse is not blown, then the current path through the fuse 14, transistor 18, and resistor 20 is established and the voltage at the output node O1 will be at ground level. Thus, to determine whether a redundant row or column is selected the voltage at output of sub arrangements associated with the row or column should be at Vcc level. If one voltage is not at the Vcc level, this signifies that the row or column is not selected.

The internal circuitry of the memory chip performs the above process for every new address. This requires that the output of the each sub arrangements 12-1 through 12-n be set at the initial voltage level (in this case Vcc) before every comparison process. After every comparison, the next comparison can only begin after the voltage at the output of all sub arrangements 12-1 through 12-n are charged up to the Vcc level. Obviously, the output of the sub arrangement with a blown fuse need not be charged to Vcc level since it is at that level already. The charging process reduces the overall operational speed of the memory. In an environment where high-speed memory chips are required, this can be problematic.

The second problem is the time required for the internal circuitry to decode the input address and to determine whether it must access a memory cell in a regular row and column intersection or a redundant row and column intersection.

In view of the above, there is a need for a redundancy scheme that overcomes these problems.

SUMMARY AND OBJECTIVES OF THE INVENTION

The object of the present invention is to provide a redundancy scheme that can be utilized in high density and high speed memory chips.

Another object of the present invention is to provide a redundancy scheme that reduces the time that is required to determine whether a redundant memory cell is to be accessed in a high density and high speed memory chip.

According to the present invention, a memory device having a plurality of memory cells arranged in rows and columns and a plurality of redundant memory cells arranged in redundant rows and columns, each of said redundant rows and columns being associated with a set of selecting means, wherein each set of selecting means is associated with a status information, a method for determining whether an external address points to a memory cell or a redundant memory cell comprising the steps of storing each of the fuse status information, comparing a decoded external address with the stored fuse status information, and based on the result of the comparing step, addressing one of the memory cells or one of the redundant memory cells.

The step where all the defective address status information is stored could occur during an initialization step, such as a power up process, or as the memory is being used during the operation of the host system.

DETAILED DESCRIPTION OF THE EMBODIMENTS

The present invention now will be described more fully with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the present application, Like numbers refer to like elements throughout.

The present invention provides a redundancy scheme that substantially reduces the time necessary to determine whether the external address is addressing a redundant or non-redundant row or column of memory.

Figure 2:
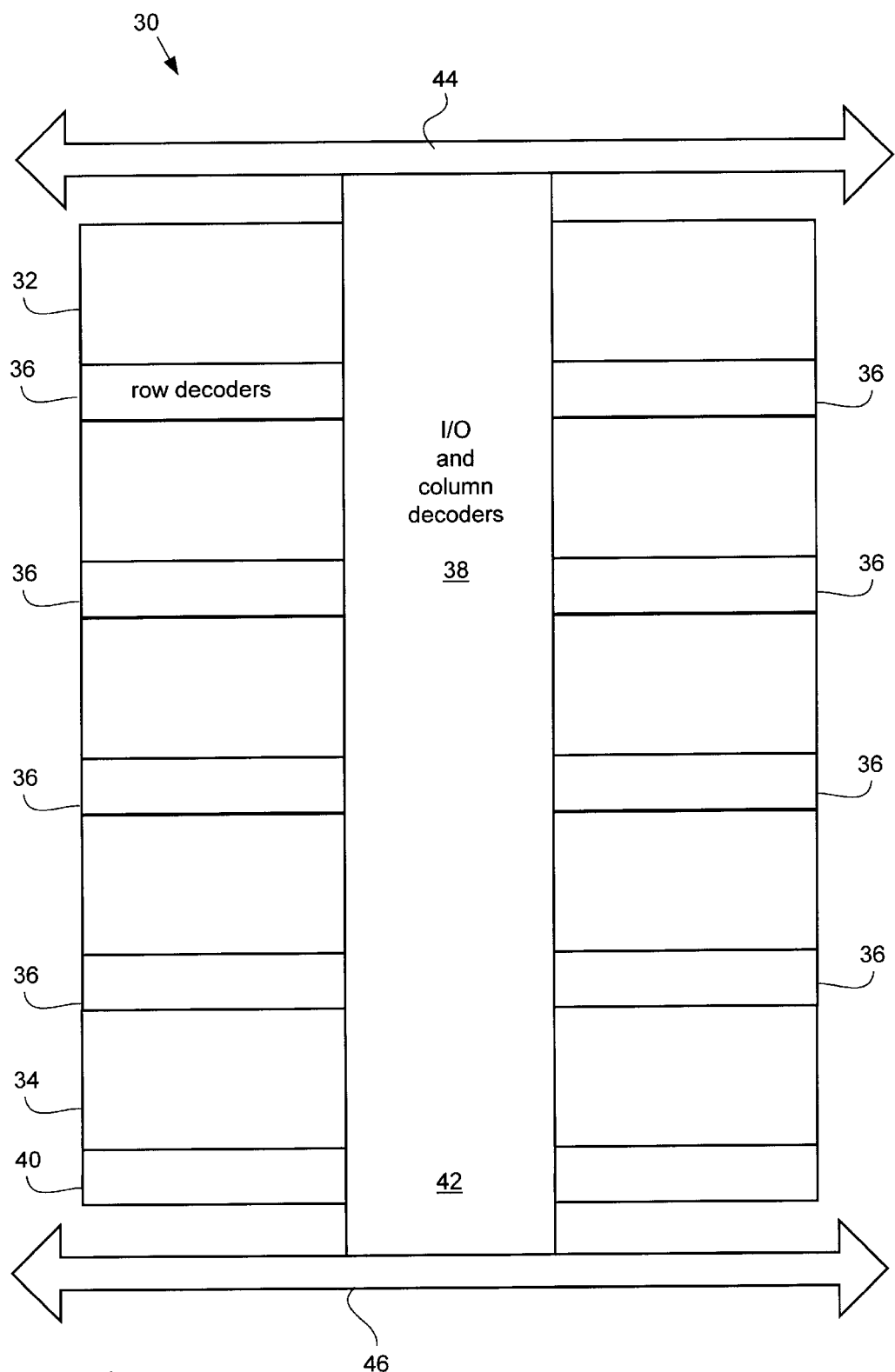
FIG. 2 presents a block diagram of a typical environment in which the redundancy scheme of the present invention could be used

Referring now to FIG. 2, a block diagram of a typical environment in which the redundancy scheme of the present invention could be used is shown. The memory 30 of FIG. 2 is an example of a high density and high capacity memory. It is noted that the example shown in FIG. 2 may not show a complete architecture of a working memory, however, for the purposes of the present invention, it provides the necessary information.

The memory 30 is divided into two sections, a memory section 32 and a redundant memory section 34. The memory section 32 includes row decoders 36 and I/O and column decoders 38. The redundant memory section 34 includes row decoders 40 and I/O and column decoders 42. Memory 30 also includes I/O logic and I/O bus 44 and redundancy logic, predecoders, and address bus 46.

Typically, the decoded external address points to a memory location in the memory section 32, unless the row or the column that includes the addressed memory cell is defective. In this situation, the decoded address points to a memory location in the redundant memory section 34. At the manufacturing stage, the manufacturer determines the defective rows or columns and replaces them with the redundant rows and columns. Each redundant row or column is identified by an identifying information. Typically, the redundant rows or columns are accessed by burning one or a combination of fuses. The address to the one or the combination of the fuses is a typical example of the identifying information. In the present invention, the identifying information is used to determine whether a redundant row or column is used.

Figure 3:
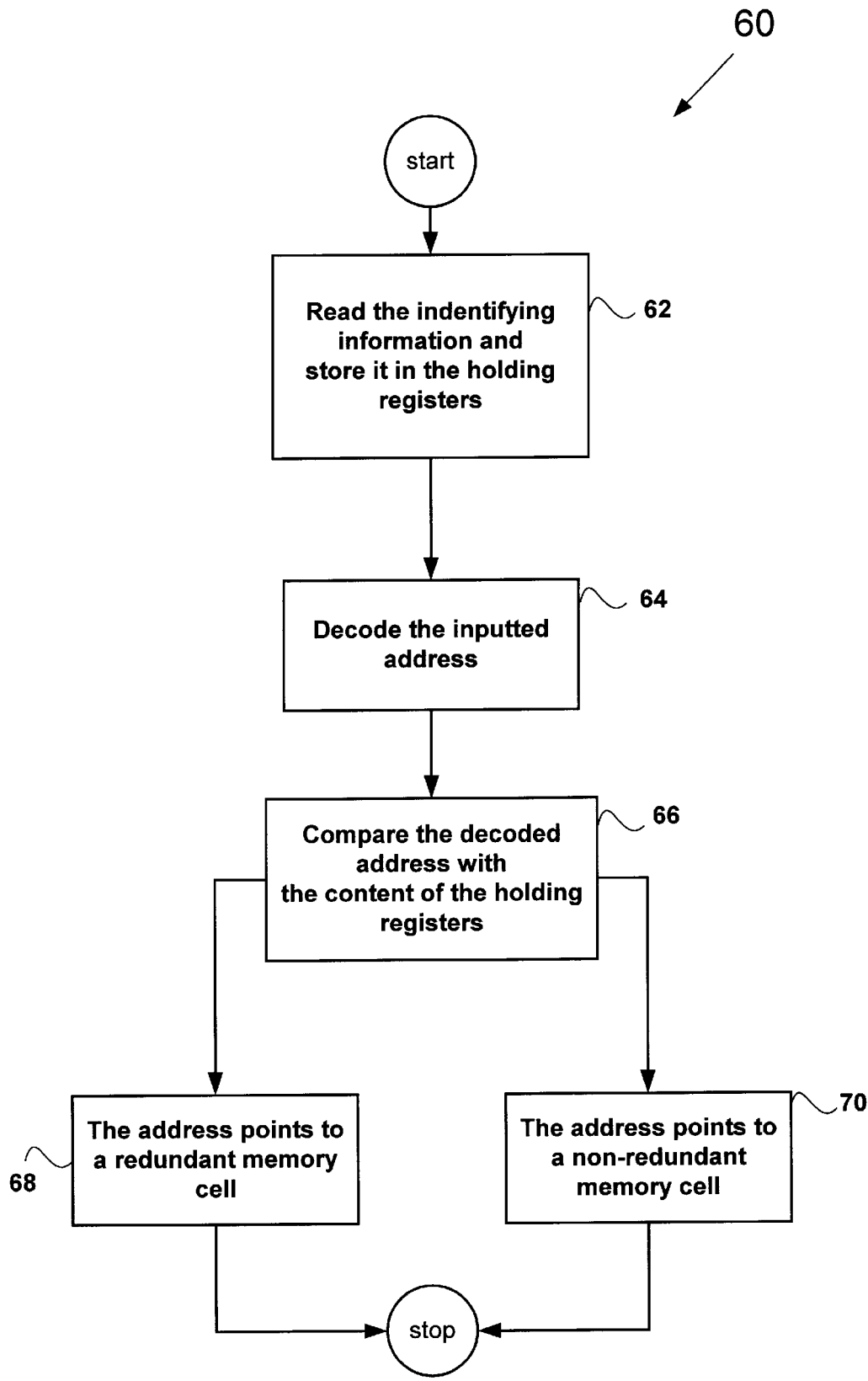
FIG. 3 is a flow diagram specifying the preferred embodiment of the redundancy scheme of the present invention.

Referring now to FIG. 3, a flow diagram specifying the preferred embodiment of the redundancy scheme of the present invention is shown. The scheme 60 of the present invention can be divided into two stages. The first stage is represented by step 62. In the preferred embodiment of the present invention, this step is performed during the power up stage in the operation of the host system using a memory chip that incorporates the present invention. Alternatively, this step can be performed periodically during the non-critical operation time of the host system using a memory chip that incorporates the present invention. The next stage that includes steps 64 through 70 is performed every time that an external address is received by the memory chip incorporating the present invention.

Figure 1:
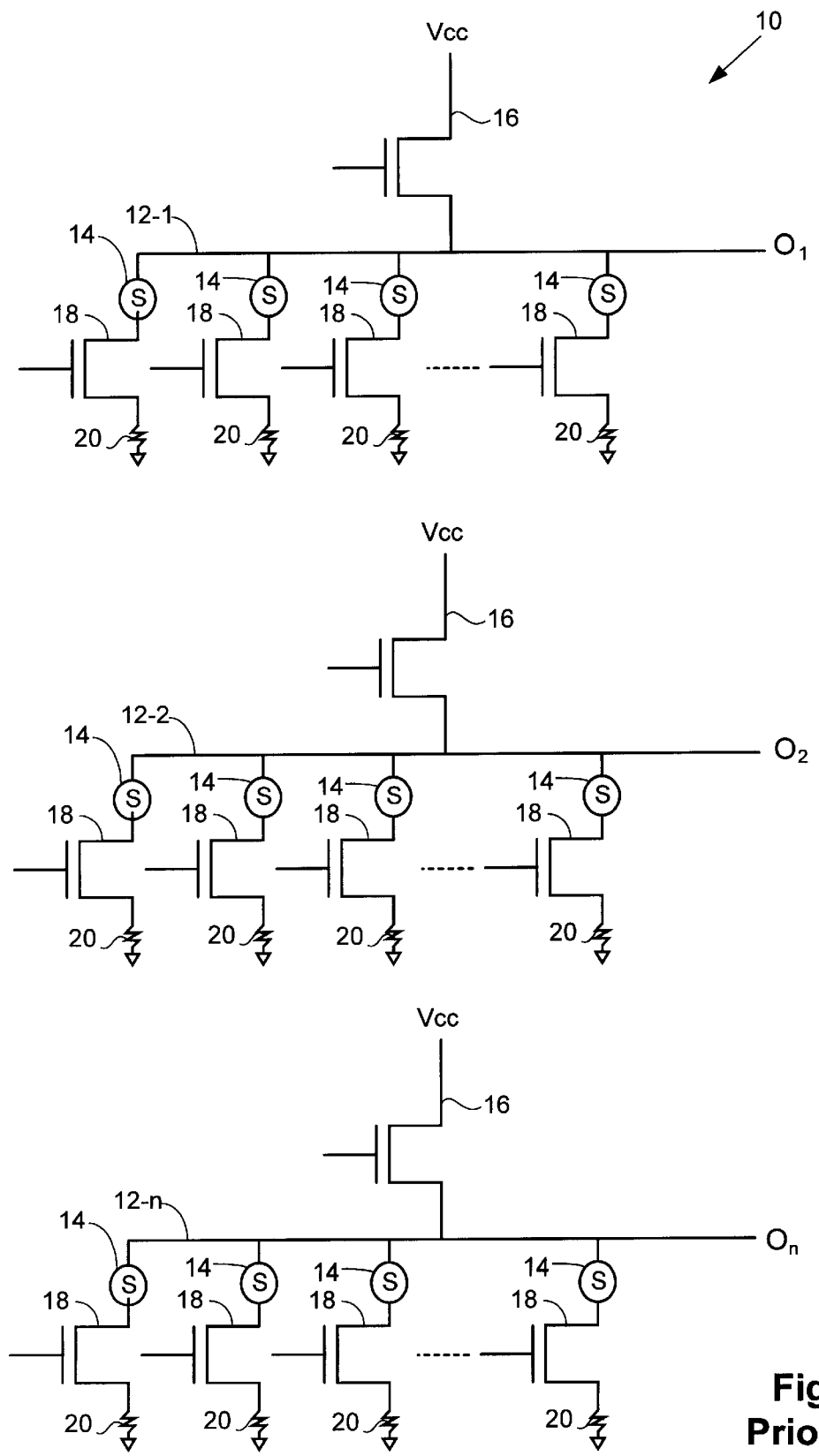
FIG. 1 is a schematic of a conventional fuse arrangement.

The scheme 60 begins by reading the identifying information of the redundant rows and columns being used in the memory chip and loading the information into a holding register, step 62. In the event that fuse architecture of FIG. 1 or any similar architecture is used, the identifying information represent the address of the set of fuses. It is noted that other means of generating identifying information for the redundant rows and columns could also be used. It is also noted that the identifying information associated with the redundant rows are stored in one set of holding registers and those associated with the redundant columns are stored in a second set of holding registers. Alternatively, all can be stored in one set of holding registers.

As mentioned above, the identifying information can be read once during the power up stage. This means that there is no need for reading the identifying information of the fuses each time that a new address is received. This is major advantage of the present invention over the existing redundancy schemes.

Alternatively, the identifying information can be read and stored periodically during the non-critical operation time of the host system, although there is no need for this. This means that the host system can ensure the integrity of the information stored in the holding registers by rereading the identifying information and restoring it in the holding registers. However, this is done when the system is not involved in critical operation, thus eliminating any degradation in the efficiency of the system.

In step 64, the received address is decoded to generate an identifying information for the desired row and column. The result of this step may be stored in a set of temporary registers or may be used directly. Different methods could be utilized to generate the identifying information based on the received address. For example, in a 16 bit address memory chip, the address bits could be divided into four 4-bit address bits, with each four bits generating an address to one fuse. In this example a combination of four fuses would enable a row or a column. Thus, the combination of the address generated from each four bits is represents the generated identifying information that is stored in the temporary registers.

Thereafter in step 66, the identifying information generated in the previous step is compared with the content of the holding registers. In the case that the holding registers are divided into those associated with the rows and those associated with the columns, the content of each set will be compared with the corresponding identifying information generated in the previous step.

If the content of the holding registers matches the identifying information generated by decoding the received address, the redundant row, column, or row and column identified by the decoded external address would be accessed, step 68. On the other hand, if there is no match, the non-redundant memory cell would be accessed. As mentioned above, steps 62–70 are repeated for every external address. However, these steps are performed at such high speed using by the hardware that overall process is done substantially faster than the conventional method.

The above process could be implemented as a software routine that is a part of the Basic Input/Output System ("BIOS") of the host system. Alternatively, it could be a software routine present in the memory chip itself.

Figure 4:
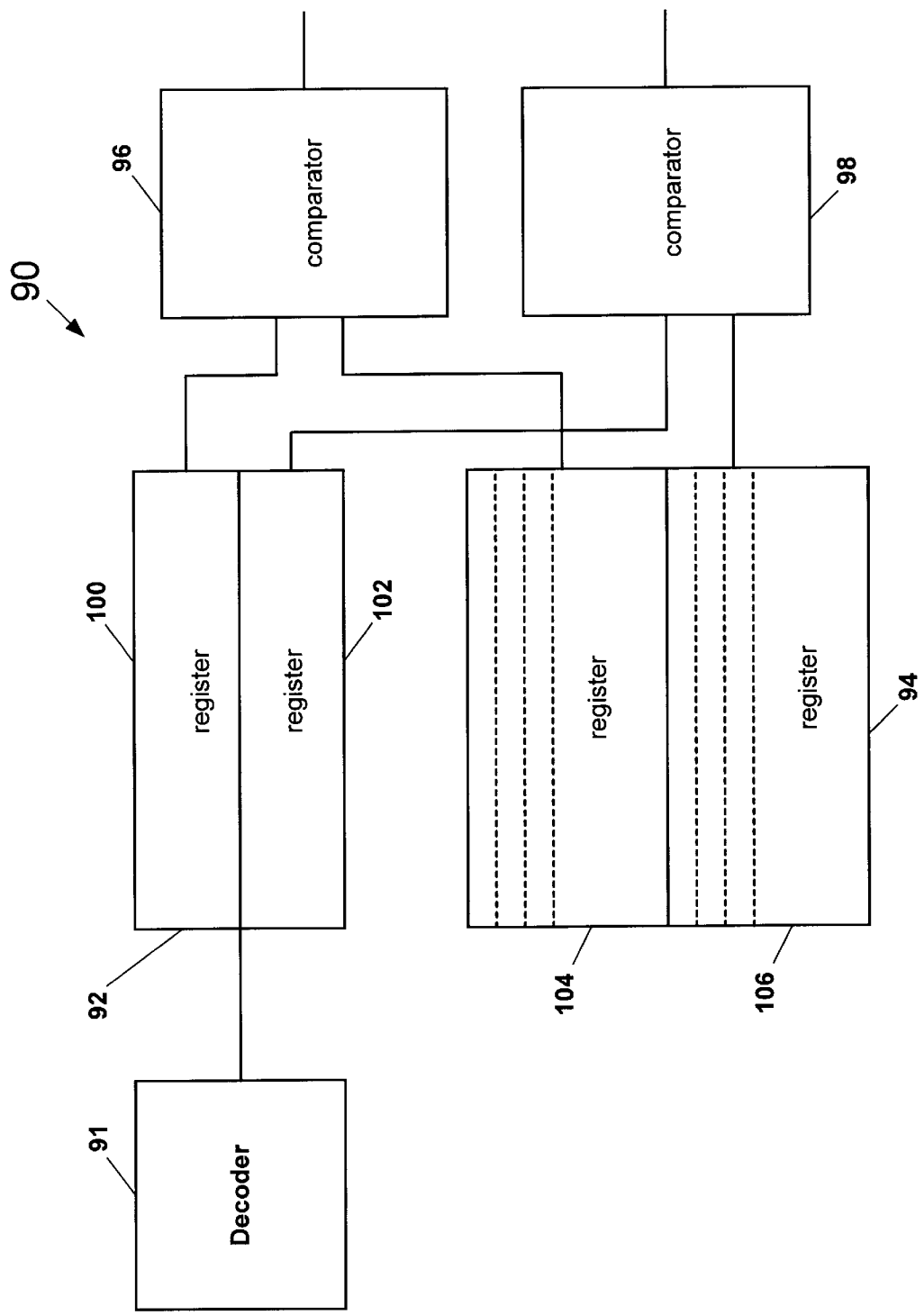
FIG. 4 is a block diagram of one alternative of the hardware used to implement the scheme of the present invention.

Referring now to FIG. 4, a block diagram of one alternative of the hardware necessary to implement the scheme of the present invention is presented. The block diagram 90 of FIG. 4 includes a decoder 91, a temporary register set 92, a holding register set 94, and comparators 96 and 98.

In the embodiment of FIG. 4, temporary resister set 92 includes two registers 100 and 102. Temporary register 92 is used to store the information generated by decoding the external address. Register 100 stores the generated information associated with a column and register 102 stores the generated information associated with a row. Alternatively, temporary register set 92 could be eliminated. Accordingly, the output of decoder 91 is compared directly with the content of the holding register set 94.

The holding register set 94 includes two banks of registers 104 and 106. They are used to store the identifying information read at the initialization or power up stage of the operation of the host system. Register bank 104 store the identifying information associated with the redundant columns and register bank 106 store identifying information associated with the redundant rows. Each entry in the register bank 104 corresponds to one redundant column and each entry in register bank 106 corresponds to one redundant row. As mentioned above, according to preferred embodiment of the present invention, the fuse identifying information is read and stored in the holding registers only once as long as the power is applied to the device. This means that as long as the power is applied to the device, the fuse bank need not be examined to get the identifying information.

Comparator 96 compares the content of register 100 with those of registers in bank 104 and comparator 98 compares the content of register 102 with those of registers in bank 106.

In operation, the external address is decoded by decoder 91 to generate the identifying information. Thereafter, the content of temporary register 100 is compared with each entry of register bank 104 and the content of temporary register 102 is compared with each entry of register bank 106. In the embodiment where the temporary register set 92 is eliminated, the output of the decoder 91 is directly compared with the content of register banks 104 and 106, respectively. The comparisons are done by comparators 96 and 98. The output of the comparators are used to determine whether a redundant row, column, or both must be accessed.

It is noted that registers 100 and 102 or the individual registers in register banks 104 and 106 could store one bit or more than one bit of information. In a high density and high capacity memory chips, the registers store more than one bit of information. Obviously, the comparators would be capable of comparing more than one bits of information in parallel.

In the drawings and specification, the preferred embodiments of the present invention have been disclosed. Although specific terms are employed, they are used in a generic and descriptive sense only and not for purposes of limitation. The scope of the present invention is set forth in the following claims.

What is claimed is:

1. A computer-readable medium containing programming instructions for determining whether an external address points to a memory cell or a redundant memory cell included in a memory device having a plurality of memory cells and plurality of redundant memory cells, wherein each of said plurality of memory cells is associated with status information, wherein when a particular memory cell is a defective memory cell, the associated status information includes a pointer that points to a corresponding particular one of the plurality of redundant memory cells that is used to replace the defective memory cell, the computer-readable medium comprising computer program code arranged to cause a host computer system coupled to the memory device to execute the operations of:

storing said status information;

receiving an external address associated with a certain one of the plurality of memory cells;

decoding the external address received by the host computer;

retrieving said stored status information corresponding to the certain one of the plurality of memory cells based upon the decoded external address; and selecting the certain one of the of plurality of memory cells corresponding to the received external address when the memory cell is not a defective memory cell or selecting the redundant memory cell pointed to by the pointer when the memory cell is a defective memory cell.

2. A computer-readable medium containing programming instructions for determining whether an external address points to a memory cell or a redundant memory cell as recited in claim 1, wherein said storing occurs during a power up process.

3. A computer-readable medium containing programming instructions for determining whether an external address points to a memory cell or a redundant memory cell as recited in claim 1, wherein said storing occurs during the operation of the memory device.

4. A computer-readable medium containing programming instructions for determining whether an external address points to a memory cell or a redundant memory cell as recited in claim 1, wherein said computer program code is part of a Basic Input/Output System (BIOS).

5. A computer-readable medium containing programming instructions for determining whether an external address points to a memory cell or a redundant memory cell as recited in claim 4, wherein said BIOS is stored in the host computer system.

6. A computer-readable medium containing programming instructions for determining whether an external address points to a memory cell or a redundant memory cell as recited in claim 4, wherein said BIOS is stored in a selected portion of the memory cells included in the memory device.

* * * * *